(12) United States Patent
Kim et al.

(10) Patent No.: US 11,237,201 B2
(45) Date of Patent: Feb. 1, 2022

(54) PARTIAL DISCHARGE DETECTING SYSTEM

(71) Applicant: LG ELECTRONICS INC., Seoul (KR)

(72) Inventors: Junghwan Kim, Seoul (KR); Taegu Kang, Seoul (KR); Byunggoo Kong, Seoul (KR); Taejung Kwon, Seoul (KR); Seungha Yoon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 301 days.

(21) Appl. No.: 16/292,821

(22) Filed: Mar. 5, 2019

(65) Prior Publication Data

US 2019/0285683 A1 Sep. 19, 2019

Related U.S. Application Data

(60) Provisional application No. 62/644,586, filed on Mar. 18, 2018.

(30) Foreign Application Priority Data

Jul. 23, 2018 (KR) .......................... 10-2018-0085665

(51) Int. Cl.
  *G01R 31/02* (2006.01)
  *G01R 31/14* (2006.01)
  (Continued)

(52) U.S. Cl.
  CPC .......... *G01R 31/14* (2013.01); *G01R 19/0092* (2013.01); *G01R 31/28* (2013.01);
  (Continued)

(58) Field of Classification Search
  CPC .... G01R 31/50; G01R 31/1272; G01R 31/14; G01R 31/52; G01R 19/0092; G01R 31/28;
  (Continued)

(56) References Cited

U.S. PATENT DOCUMENTS 8,126,664 B2 * 2/2012 Fournier ............ G01R 31/1272
  702/59
8,843,349 B2  9/2014 Kang et al.
  (Continued)

FOREIGN PATENT DOCUMENTS

CN       106569099 A   *  4/2017
JP         5935850 B2      6/2016
  (Continued)

*Primary Examiner* — Raul J Rios Russo
(74) *Attorney, Agent, or Firm* — Birch, Stewart, Kolasch & Birch, LLP

(57) ABSTRACT

A partial discharge detecting system includes a partial discharge detecting device to generate a reference frequency signal, to detect a partial discharge pulse signal, and to convert the detected partial discharge pulse signal into a partial discharge digital signal, a main processor to synchronize the partial discharge digital signal, based on a zero-phase point of the reference frequency signal, to extract effective data from the synchronized partial discharge digital signal, and to store the extracted effective data, and an energy harvesting power supply device to supply power to the partial discharge detecting device and the main processor.

15 Claims, 11 Drawing Sheets

(51) Int. Cl.
*H03K 3/01* (2006.01)
*H02J 7/35* (2006.01)
*H02J 3/38* (2006.01)
*G01R 31/52* (2020.01)
*G01R 31/50* (2020.01)
*G01R 19/00* (2006.01)
*G01R 31/28* (2006.01)
*G01R 31/58* (2020.01)
*G01R 31/00* (2006.01)
*G01R 31/40* (2020.01)

(52) U.S. Cl.
CPC .............. *G01R 31/50* (2020.01); *G01R 31/52* (2020.01); *G01R 31/58* (2020.01); *H02J 3/383* (2013.01); *H02J 7/35* (2013.01); *H03K 3/01* (2013.01); *G01R 31/001* (2013.01); *G01R 31/002* (2013.01); *G01R 31/40* (2013.01)

(58) Field of Classification Search
CPC .... G01R 31/58; G01R 31/001; G01R 31/002; G01R 31/40; H02J 3/383; H02J 7/35; H02J 50/001; H03K 3/01; Y02E 10/56

USPC .......... 324/537, 71, 378, 403, 415, 425, 500
See application file for complete search history.

(56) References Cited

U.S. PATENT DOCUMENTS

| | | | |
|---|---|---|---|
| 10,024,903 | B2 | 7/2018 | Di Stefano et al. |
| 10,317,451 | B2* | 6/2019 | Yoshimura ......... G01R 31/1254 |
| 2011/0172970 | A1 | 7/2011 | Kang et al. |
| 2012/0209572 | A1* | 8/2012 | Cavallini ............... G01R 31/14 |
| | | | 702/189 |
| 2015/0260777 | A1* | 9/2015 | Di Stefano ........ G01R 31/1227 |
| | | | 324/536 |
| 2016/0274176 | A1* | 9/2016 | Di Stefano ........ G01R 31/1227 |
| 2017/0230074 | A1* | 8/2017 | Rose .................... H04B 1/1036 |

FOREIGN PATENT DOCUMENTS

| | | | | |
|---|---|---|---|---|
| KR | 10-1760143 B1 | 7/2017 | | |
| TW | 201017893 A | * 5/2010 | ............. | H01L 31/02 |
| WO | WO 2016/042675 A1 | 3/2016 | | |

* cited by examiner

FIG. 3
60 HZ REFERENCE FREQUENCY SIGNAL
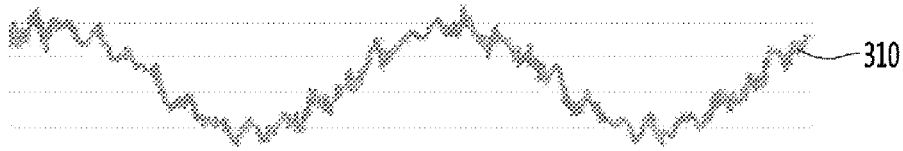
PD PULSE SIGNAL
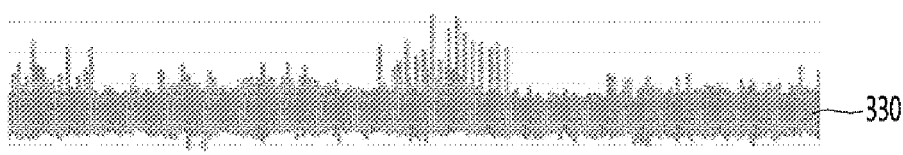
FIG. 4
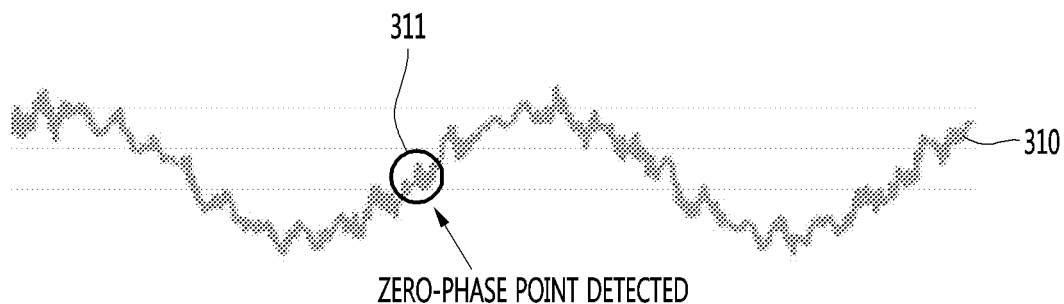
ZERO-PHASE POINT DETECTED
FIG. 5
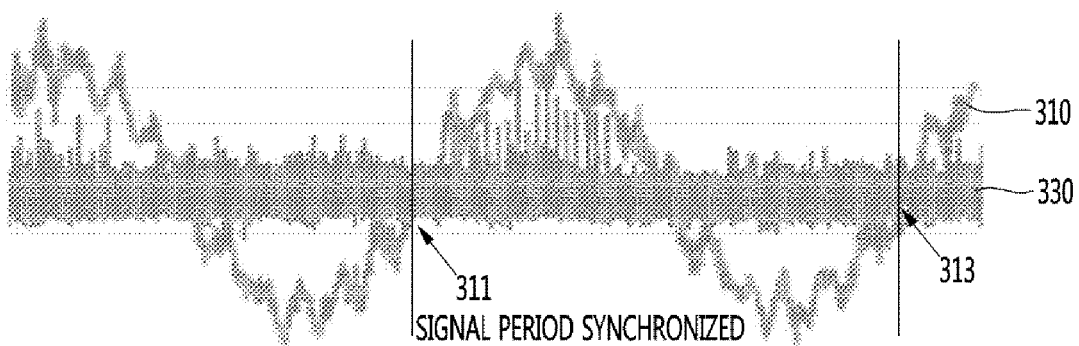
SIGNAL PERIOD SYNCHRONIZED (a) VOID DISCHARGE WAVEFORM (b) CORONA DISCHARGE WAVEFORM

PARTIAL DISCHARGE DETECTING SYSTEM

CROSS-REFERENCE TO RELATED APPLICATIONS

This application claims priority under 35 U.S.C. 119 and 365 to U.S. Provisional Application No. 62/644,586 filed on Mar. 18, 2018, and under 35 U.S.C. § 119(a) to Patent Application No. 10-2018-0085665, filed in the Republic of Korea on Jul. 23, 2018, the disclosures of which are incorporated herein by reference.

BACKGROUND

The present invention relates to a partial discharge detecting system capable of detecting partial discharge.

When power facilities are aged or high-voltage stress is applied to the power facilities, various phenomena such as partial discharge may be caused.

Such phenomena serve as causes of the failure of the power facilities. If the power facilities are properly replaced or repaired, the failure of the power facilities, such as flashover, may be caused.

The partial discharge may be caused in various forms depending on wires, facilities, or environments that the partial discharge are caused. In addition, it is difficult to exactly measure the partial discharge.

Various trials have been performed to detect the partial discharge in advance and to preserve power facilities, which is difficult actually. Currently, many manufacturers have provided equipment for detecting the partial discharge by using sensors, but the price of the equipment is high. In addition, a person has to personally measure the partial discharge while making the rounds.

In addition, a partial discharge signal is sensed in the form of a high frequency signal through a wide-band response sensor. Conventionally, high-speed signal processing is typically performed by employing a system such as a high-speed analog-to-digital converter (ADC) and a field programmable gate array (FPGA)/digital signal processor (DSP)/Ext.

In addition, a 60 Hz electrical signal serving as a criterion of phase analysis is received to an additional ADC and employed for the analysis. The sensing signal has the frequency of a few tens to hundreds MHz. A measurement device performs signal processing through signal sampling at about 10 MHz to about 100 MHz.

However, according to the manner, although the high-speed signal processing is possible, the configuration of a circuit is complicated and the price of the circuit is high. In addition, since a large amount of data is processed, it is difficult to process the data at a communication rate of LPWAN suggested in Internet over things (IoT).

SUMMARY

The present invention is to provide a partial discharge detecting system capable of processing sensing data without the use of an external memory by using a several-MHz ADC and changing a data processing manner from a continuously data processing manner to a discretely data processing manner.

The present invention is to attach a sensor system to a relevant position by employing Internet of thing (IoT) technology to manage partial discharge by using a sensor network.

The present invention is to simplify a circuit to measure partial discharge and to optimize an analysis algorithm of the partial discharge.

According to an embodiment of the present invention, a partial discharge detecting system includes a partial discharge detecting device to generate a reference frequency signal, to detect a partial discharge pulse signal, and to convert the detected partial discharge pulse signal into a partial discharge digital signal, a main processor to synchronize the partial discharge digital signal, based on a zero-phase point of the reference frequency signal, to extract effective data from the synchronized partial discharge digital signal, and to store the extracted effective data, and an energy harvesting power supply device to supply power to the partial discharge detecting device and the main processor.

According to various embodiments of the present invention, since only effective data for the partial discharge is stored, the sensing data may be processed at a lower price without an external memory.

BRIEF DESCRIPTION OF THE DRAWINGS

FIG. 3 is a graph illustrating a reference frequency signal and a PD pulse digital signal according to an embodiment of the present invention.

FIG. 4 is a graph illustrating an example of detecting a zero-phase point from a reference frequency signal according to an embodiment of the present invention.

FIG. 5 is a graph illustrating the procedure of synchronizing a reference frequency signal with a PD pulse digital signal according to an embodiment of the present invention.

DETAILED DESCRIPTION OF THE EMBODIMENTS

Description will now be given in detail according to exemplary embodiments disclosed herein, with reference to the accompanying drawings. For the sake of brief description with reference to the drawings, the same or equivalent components may be provided with the same reference numbers, and description thereof will not be repeated. In general, a suffix such as "module" and "unit" may be used to refer to elements or components.

Figure 1:
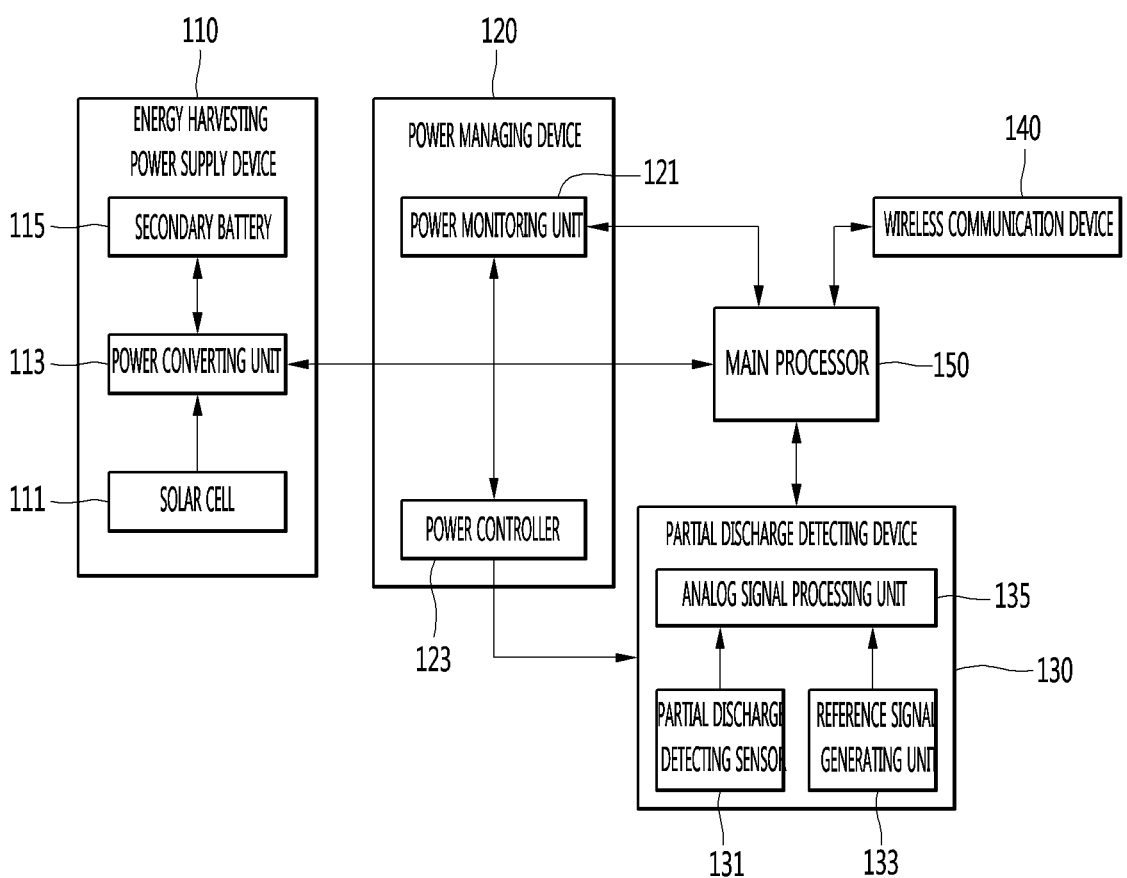
FIG. 1 is a block diagram illustrating the configuration of a partial discharge detecting system according to an embodiment of the present invention.

FIG. 1 is a block diagram illustrating the configuration of a partial discharge detecting system according to an embodiment of the present invention.

A partial discharge detecting system 100 according to the embodiment described below may be mounted in electric power distribution facilities.

Referring to FIG. 1, the partial discharge detecting system 100 according to an embodiment of the present invention may include an energy harvesting power supply device 110, a power managing device 120, a partial discharge detecting device 130, a wireless communication device 140, and a main processor 150.

The energy harvesting power supply device 110 may supply power necessary for an internal operation of the partial discharge detecting system 100.

The partial discharge detecting system 100 may include a solar cell 111, a power converting unit 113, and a secondary battery 115.

The solar cell 111 may include a solar cell array and may absorb solar energy.

The power converting unit 113 may convert the solar energy absorbed by the solar cell 111 into electrical energy.

The secondary battery 115 may store the converted electrical energy.

The power managing device 120 may manage the power state of the partial discharge detecting system 100.

The power managing device 120 may include a power monitoring unit 121 and a power controller 123.

The power monitoring unit 121 may monitor an amount of charge remaining in the secondary battery 115.

The main processor 150 may periodically transmit an amount of charge remaining in the secondary battery 115, which is monitored by the power monitoring unit 121, to a managing server through the wireless communication device 140.

The power controller 123 may periodically activate or deactivate the operations of the partial discharge detecting device 130 and the wireless communication device 140 under the control of the main processor 150.

In the partial discharge detecting system 100 according to an embodiment of the present invention, since an energy harvesting scheme is employed, low-power driving may be required and power consumption may be reduced in a sleep/wake-up mode.

The partial discharge detecting device 130 may detect a partial discharge signal and may transmit the detected partial discharge signal to the main processor 150.

The partial discharge detecting device 130 may include a partial discharge detecting sensor 131, a reference signal generating unit 133, and an analog signal processing unit 135.

The partial discharge detecting sensor 131 may generate a partial discharge (PD) pulse signal and may transmit the generated PD pulse signal to the analog signal processing unit 135.

The reference signal generating unit 133 may generate a reference frequency signal to synchronize with the PD pulse signal and may transmit the generated reference frequency signal to the analog signal processing unit 135.

The analog signal processing unit 135 may convert the PD pulse signal to a PD pulse digital signal.

The wireless communication device 140 may wirelessly make communication with an external managing server or a partial discharge analysis system.

The wireless communication device 140 may transmit power state information of the secondary battery 115 to the external managing server based on a low power wide area network standard.

In addition, the wireless communication device 140 may transmit an effective data packet containing information on partial discharge to a partial discharge analysis system or to an external managing server through the low power wide area network standard.

The main processor 150 may control the overall operation of the partial discharge detecting system 100.

The main processor 150 may activate the partial discharge (PD) detecting sensor (PD detecting sensor) 131 and may input a reference frequency signal to the analog signal processing unit 135.

The main processor 150 may detect zero-phase points of the reference frequency signal.

The main processor 150 may synchronize the reference frequency signal with the PD pulse digital signal, based on the detected zero phase points.

The main processor 150 may buffer a one-cycle unit PD digital signal of the synchronized PD pulse digital signal.

The main processor 150 may acquire a reference voltage for detecting effective data, based on noise from the one-cycle unit PD digital signal which is buffered.

The main processor 150 may extract a PD peak point from a plurality of PD points included in the unit PD digital signal by using the acquired reference voltage.

The main processor 150 may extract effective data having information on the detected PD peak points.

The main processor 150 may determine whether the cycles of a PD pulse signal are ensured by the reference number of times necessary for a PRPD analysis scheme.

The main processor 150 may transmit, to the external managing server or to the partial discharge analysis system, the effective data packet which is the combination of the effective data, when the cycles of the PD pulse signal are ensured by the reference number of times necessary for the PRPD analysis scheme.

Figure 2:
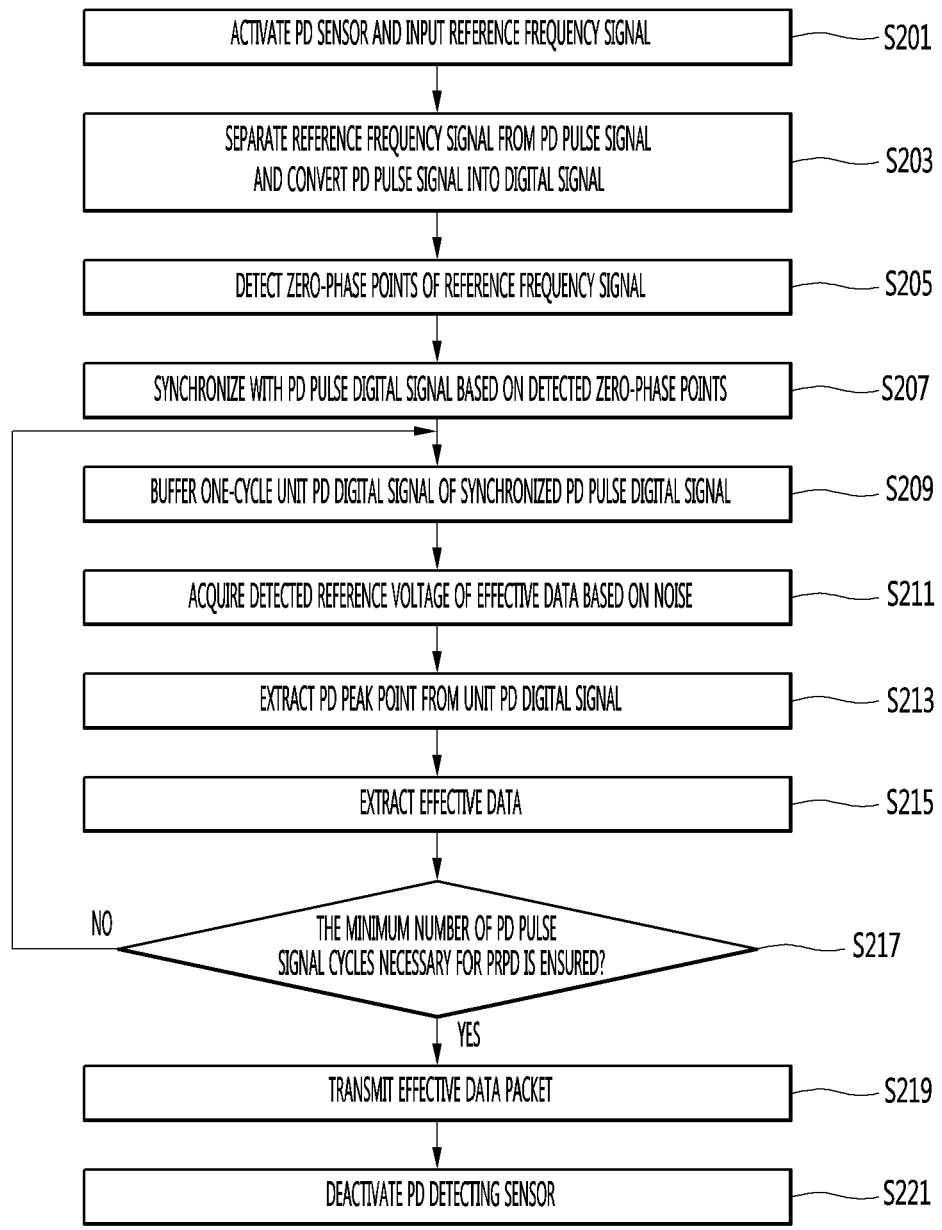
FIG. 2 is a flowchart illustrating a method for detecting the partial discharge of the partial discharge detecting system according to an embodiment of the present invention.

FIG. 2 is a flowchart illustrating a method for detecting the partial discharge of the partial discharge detecting system according to an embodiment of the present invention.

Referring to FIG. 2, the main processor 150 may activate the PD detecting sensor 131 and may input a reference frequency signal to the analog signal processing unit 135 (S201).

According to an embodiment, as the PD detecting sensor 131 is activated, the PD detecting sensor 131 may generate the PD pulse signal and may transmit the generated PD pulse signal to the analog signal processing unit 135.

In addition, the reference signal generating unit 133 may generate the reference frequency signal and may transmit the generated reference frequency signal to the analog signal processing unit 135.

According to another embodiment, the reference signal generating unit 133 may receive the reference frequency signal from the outside and may transmit the received reference frequency signal to the analog signal processing unit 135.

According to an embodiment, the reference frequency signal may be a frequency signal having the frequency of 60 Hz, which is provided only for the illustrative purpose.

The reference frequency signal may be a frequency signal serving as a criterion for phase information.

The analog signal processing unit 135 of the partial discharge detecting device 130 may separate the reference frequency signal from the PD pulse signal and may convert the separated PD pulse signal into the PD pulse digital signal (S203).

The details thereof will be described with reference to FIG. 3.

FIG. 3 is a graph illustrating the reference frequency signal and the PD pulse digital signal according to an embodiment of the present invention.

FIG. 3 shows a PD pulse digital signal 330 obtained by processing a 60 Hz reference frequency signal 310 and a PD pulse signal through ADC.

Description will be made again with reference to FIG. 2.

The main processor 150 detects zero-phase points of a reference frequency signal (S205).

The zero-phase point will be made with reference to FIG. 4.

FIG. 4 is a graph illustrating an example of detecting a zero-phase point from a reference frequency signal according to an embodiment of the present invention.

Referring to FIG. 4, the main processor 150 may detect a zero-phase point 311, which represents the phase of '0', from the reference frequency signal 310.

The main processor 150 may detect at least one zero-phase point from the reference frequency signal 310. The zero-phase point may be used to synchronize the PD pulse digital signal with the reference frequency signal thereafter.

Description will be made again with reference to FIG. 2.

The main processor 150 may synchronize the reference frequency signal with the PD pulse digital signal, based on the detected zero phase points (S207).

According to an embodiment, the main processor 150 may synchronize the reference frequency signal with the PD pulse digital signal based on zero-phase points to detect the partial discharge signal through a phase resolved partial discharge (PRPD) scheme.

The PRPD scheme may be a scheme for analyzing a pattern of the partial discharge signal periodically generated in the same phase.

FIG. 5 is a graph illustrating the procedure of synchronizing the reference frequency signal with the PD pulse digital signal according to an embodiment of the present invention.

Referring to FIG. 5, the main processor 150 may synchronize the reference frequency signal 310 with the PD pulse digital signal 330, based on the zero-phase point 311 of the reference frequency signal 310.

The reason for the synchronization is to periodically detect a pattern of the partial discharge signal periodically generated in the same phase.

Description will be made again with reference to FIG. 2.

The main processor 150 may buffer a one-cycle unit PD digital signal of the synchronized PD pulse digital signal (S209).

According to an embodiment, the main processor 150 may buffer a one-cycle unit PD digital signal of the synchronized PD pulse digital signal synchronized with the reference frequency signal.

According to an embodiment, buffering the one-cycle unit PD digital signal may represent a work of temporarily storing one-cycle digital data.

Figure 6:
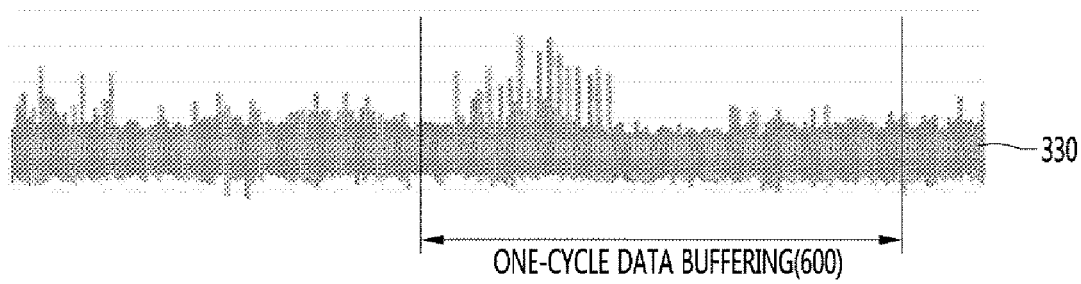
FIG. 6 is a graph illustrating the procedure of buffering a unit PD digital signal in one cycle from a PD pulse digital signal according to an embodiment of the present invention.

FIG. 6 is a graph illustrating the procedure of buffering a one-cycle unit PD digital signal of a PD pulse digital signal according to an embodiment of the present invention.

Referring to FIG. 6, the main processor 150 may buffer a unit PD digital signal 600 in one cycle based on a zero-phase point, from the PD pulse digital signal 330 synchronized with the reference frequency signal.

Description will be made again with reference to FIG. 2.

The main processor 150 may acquire a reference voltage for detecting the effective data, based on noise from the unit PD digital signal in one cycle which is buffered (S211).

According to an embodiment, the reference voltage may be a voltage used to detect a PD peak point having information on the partial discharge from the unit PD digital signal in one cycle.

The reference voltage may be a preset voltage.

The main processor 150 may extract a PD peak point from a plurality of PD points included in the unit PD digital signal by using the acquired reference voltage (S213).

The details thereof will be described with reference to FIGS. 7 and 8.

Figure 7:
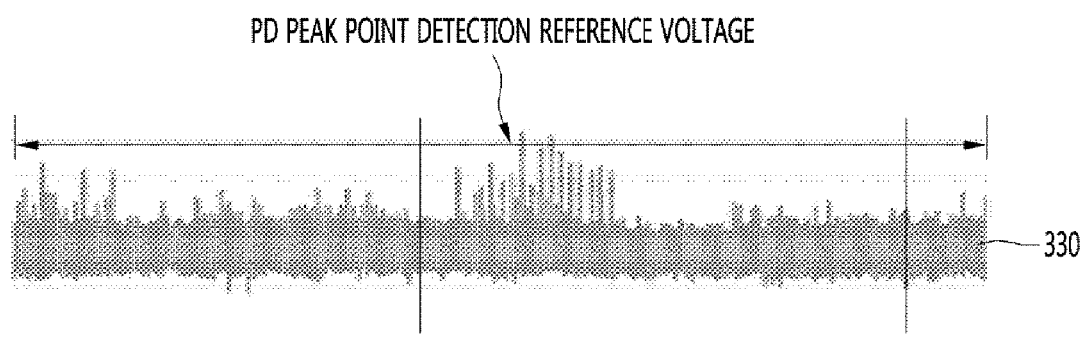
FIG. 7 is a graph illustrating a reference voltage serving as a criterion for detecting a PD peak point according to an embodiment of the present invention.
Figure 8:
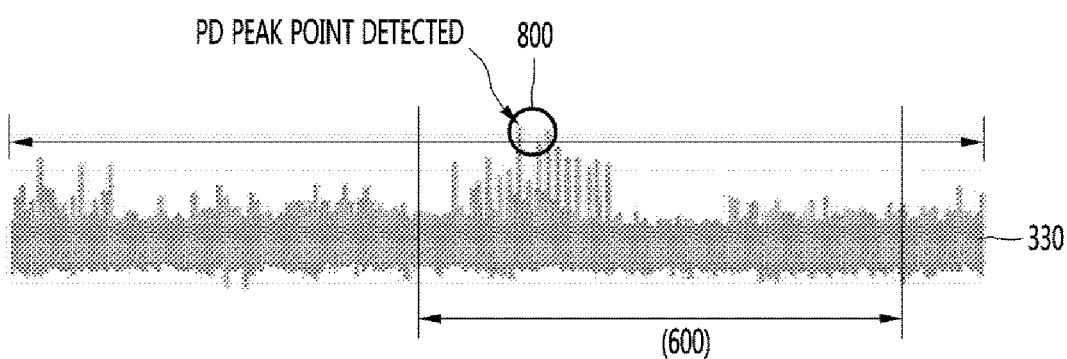
FIG. 8 is a graph illustrating a procedure of detecting a PD peak point by using the reference voltage according to an embodiment of the present invention.

FIG. 7 is a graph illustrating a reference voltage serving as a criterion for detecting a PD peak point according to an embodiment of the present invention, and FIG. 8 is a graph illustrating a procedure of detecting a PD peak point by using the reference voltage according to an embodiment of the present invention.

Referring to FIG. 7, the main processor 150 may set a reference voltage serving as a criterion for detecting a PD peak point.

Thereafter, the main processor 150 may detect a PD peak point 800 exceeding the reference voltage, from PD digital data 600 in one cycle, as illustrated in FIG. 8.

The PD peak point 800 may include information on a peak voltage and a phase corresponding to the peak voltage.

Description will be made again with reference to FIG. 2.

The main processor 150 extracts effective data having the information on the detected PD peak points (S215).

According to an embodiment, the effective data, which serves as data extracted from the PD peak point, may include a peak voltage and a phase of the PD peak point.

Hereinafter, steps S205 to S215 will be collectively described.

Figure 9:
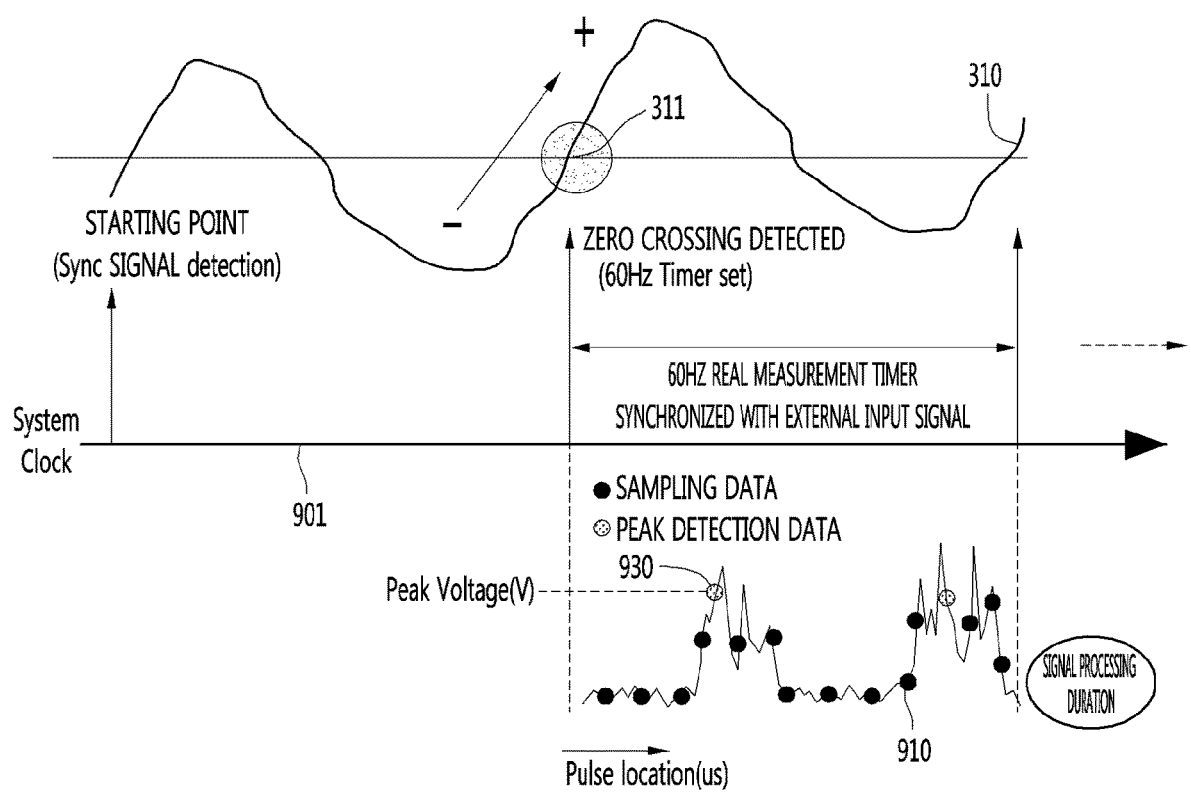
FIG. 9 is a view collectively illustrating the procedure of extracting the effective data according to an embodiment of the present invention.

FIG. 9 is a view collectively illustrating the procedure of extracting the effective data according to an embodiment of the present invention.

Referring to FIG. 9, the main processor 150 may detect a zero-phase point 311 from a reference frequency signal 310. The zero-phase point 311 may a point corresponding to an inflection point at which a negative phase is changed to a positive phase.

The main processor 150 may extract a starting point for synchronizing with a PD pulse digital signal, based on the reference frequency signal 310.

The main processor 150 may convert the extracted starting point into system clock information which is able to be utilized in common to synchronize with the PD pulse digital signal.

Thereafter, the main processor 150 extracts a unit PD digital signal in one cycle in match with a system clock 901 corresponding to a starting point periodically repeated.

The main processor 150 may sample 40,000 PD points from the PD digital data in one cycle. In this case, 40,000 is a number provided only for the illustrative purpose.

The main processor 150 may perform signal processing for a plurality of PD points and may acquire the magnitude and the phase of a voltage for each of the PD points from the processing result.

The main processor 150 may extract, as effective PD points 930, only PD points having the voltage magnitude exceeding the reference voltage and may store data for the extracted effective PD points 930.

The PD pulse digital data ensured at the sampling rate of 2.4 MHz are stored in number corresponding to 40,000 PD points, based on one cycle of a 60 Hz reference frequency signal.

When PD pulse data in 100 cycles are processed, an excessively large memory capacity is required to the extent that an additional external memory is necessary for storing the PD pulse data in 100 cycles.

According to an embodiment of the present invention, to prevent this, the main processor 150 may synchronize a unit PD digital signal in one cycle every time, may store only data for the effective PD point, and may repeatedly perform such an operation in each cycle.

Accordingly, when the PD pulse digital data in 100 cycles is analyzed, the necessary memory capacity is reduced to $1/100$. Accordingly, the memory capacity may be minimized without a large capacity of an external memory.

Figure 10:
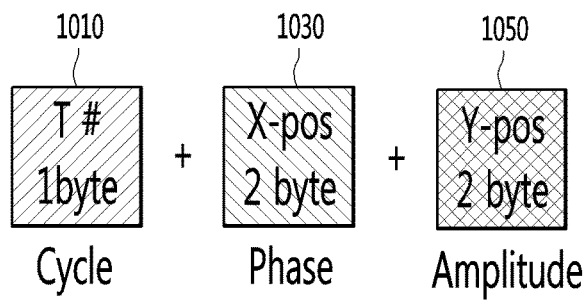
FIG. 10 is a view illustrating the structure of effective data having the information on the effective PD point representing the partial discharge according to an embodiment of the present invention.

Meanwhile, effective data for the effective PD point 930 may be compressed to the form illustrated in FIG. 10 and may be transmitted.

FIG. 10 is a view illustrating the structure of effective data having information on an effective PD point representing partial discharge according to an embodiment of the present invention.

Referring to FIG. 10, effective data 1000 contains cycle information 1010, phase information 1030, and magnitude information 1050.

The cycle information 1010 includes information indicating the sequence of a cycle that the relevant effect data is positioned.

The phase information 1030 includes information indicating a phase detected from the effective PD point 930.

The magnitude information 1050 contains information indicating the magnitude of the voltage detected from the effective PD point 930.

The main processor 150 may generate the effective data 1000 by compressing the cycle information 1010, the phase information 1030, and the magnitude information 1050.

The main processor 150 may make the combination of the effective data 1000 in the form of a packet and may transmit the packet to an external system through the wireless communication device 140.

Description will be made again with reference to FIG. 2.

The main processor 150 may determine whether PD pulse signal cycles are ensured by the reference number of times necessary for the PRPD analysis scheme.

The reference number of times may be the number of times necessary for detecting partial discharge by analyzing the effective data through the PRPD scheme.

According to an embodiment, although the reference number of times may be 100 cycles, 100 is a number provided only for the illustrative purpose.

The main processor 150 transmits an effective data packet, which is the combination of the effective data, to the outside when the cycles of the PD pulse signal are ensured by the reference number of times necessary for the PRPD scheme (S219).

According to an embodiment, the main processor 150 may transmit the effective data packet, which is the combination of the effective data, to the PD analysis system through the wireless communication device 140.

For example, the effective data packet may be the combination of 100 effective data collected for 100 cycles.

The details thereof will be described with reference to FIG. 11.

Figure 11:
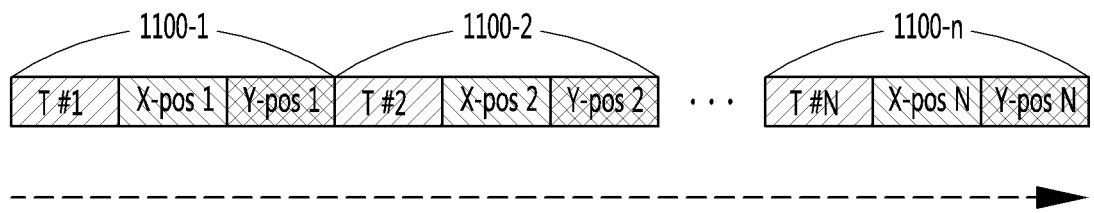
FIG. 11 is a view illustrating the combination of effective data packets according to an embodiment of the present invention.

FIG. 11 is a view illustrating the combination of effective data according to an embodiment of the present invention.

Referring to FIG. 11, an effective data packet 1100 may include a plurality of effective data 1100-1 to 1100-n.

Each effective data may include cycle information, phase information of a PD peak point sampled in the relevant cycle, and the magnitude information of the PD peak point sampled in the relevant cycle.

The main processor 1500 may transmit the effective data packet 1100 to the PD analysis system through the wireless communication device 140.

As described above, when the PD sensing data is compressed to the array of effective data, data transmission is possible over a lower power sensor network through a conventional high-speed cable transmission scheme.

Description will be made again with reference to FIG. 2.

Thereafter, the main processor 150 deactivates the PD detecting sensor 131 (S221).

Figure 12:
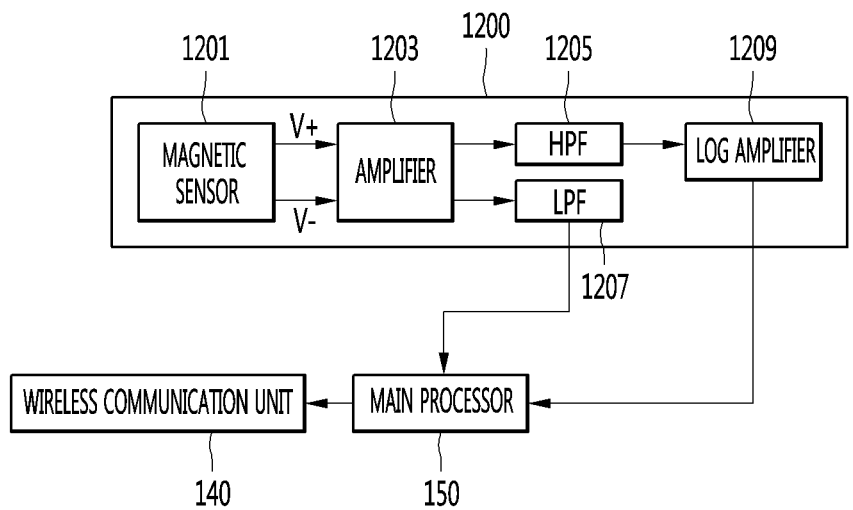
FIG. 12 is a view illustrating the configuration of the partial discharge detecting sensor according to an embodiment of the present invention.

FIG. 12 is a view illustrating the configuration of the partial discharge detecting sensor according to an embodiment of the present invention.

A partial discharge detecting sensor 1200 illustrated in FIG. 12 may be substituted with the partial discharge detecting sensor 131 illustrated in FIG. 1.

Referring to FIG. 12, a partial discharge detecting sensor 1200 according to an embodiment of the present invention may include a magnetic sensor 1201, an amplifier 1203, a high-pass filter 1205, a low-pass filter 1207, and a log amplifier 1209.

The magnetic sensor 1201 may sense a partial discharge pulse signal and a phase-current signal.

The magnetic sensor 1201 may be configured in the form of a full bridge or a half bridge.

The amplifier 1203 may amplify a partial discharge pulse signal and a phase current signal output from the magnetic sensor 1201.

The amplifier 1203 may include a differential amplifier.

The high-pass filter 1205 may remove a noise signal from the partial discharge pulse signal.

The low-pass filter 1207 may be a filter to pass a reference frequency signal.

The log amplifier 1209 may determine the occurrence of partial discharge and the occurrence degree of the partial discharge by using the partial discharge pulse signal obtained through the high-pass filter 1205.

Figure 13A:
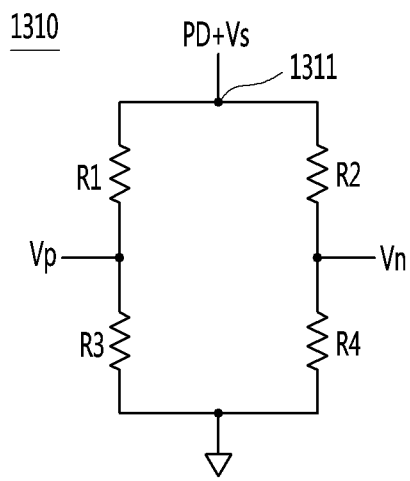
FIG. 13A is a circuit diagram illustrating the configuration of a typical magnetic sensor.
Figure 13B:
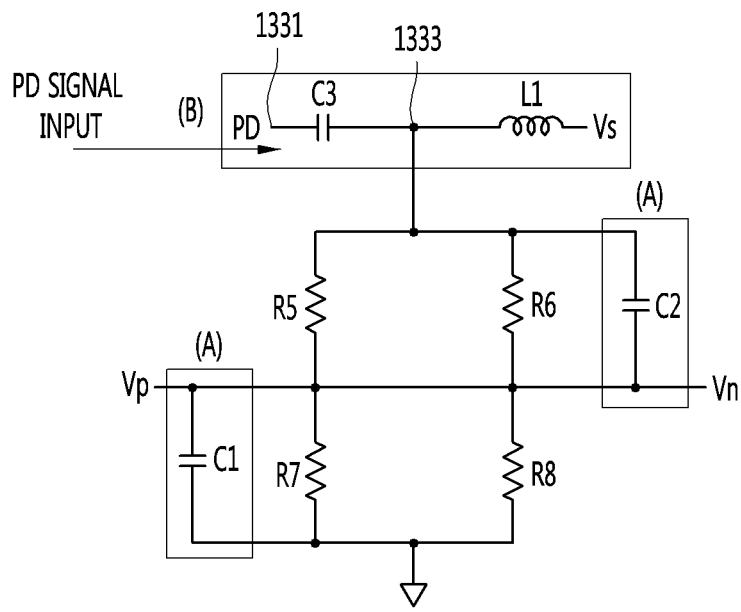
FIG. 13B is a circuit diagram illustrating the configuration of a magnetic sensor according to an embodiment of the present invention.

FIG. 13A is a circuit diagram illustrating the configuration of a typical magnetic sensor, and FIG. 13B is a circuit diagram illustrating the configuration of a magnetic sensor according to an embodiment of the present invention.

Referring to FIG. 13A, a conventional magnetic sensor 1310 outputs, through terminals Vp and Vn, electromagnetic signals having the phase difference of 180° depending on intensities of a magnetic field.

However, the conventional magnetic sensor 1310 does not represent an excellent response characteristic to a high-frequency electromagnetic signal, which is input, and an excellent output characteristic of Vp or Vn.

Referring to FIG. 13B, according to an embodiment of the present invention, a magnetic sensor 1330 may include two capacitors C1 and C2 to output high-frequency partial discharge signals without the loss of the high-frequency partial discharge signals, which is caused by Vn or the difference between Vp and Vn, while preventing an influence exerted on a magnetic field generated from the magnetic sensor 1330.

The first capacitor C1 may be connected with the terminal Vp, and the second capacitor C2 may be connected with the terminal Vn.

In addition, the magnetic sensor 1330 may include a capacitor C3 and an inductor L1 such that the high-frequency partial discharge signal is input without signal loss and the mutual interference with a DC power source Vs.

In addition, a pad having a large area may be attached to the input terminal for the partial discharge signal to enhance the reception sensitivity of the partial discharge signal.

Figure 14:
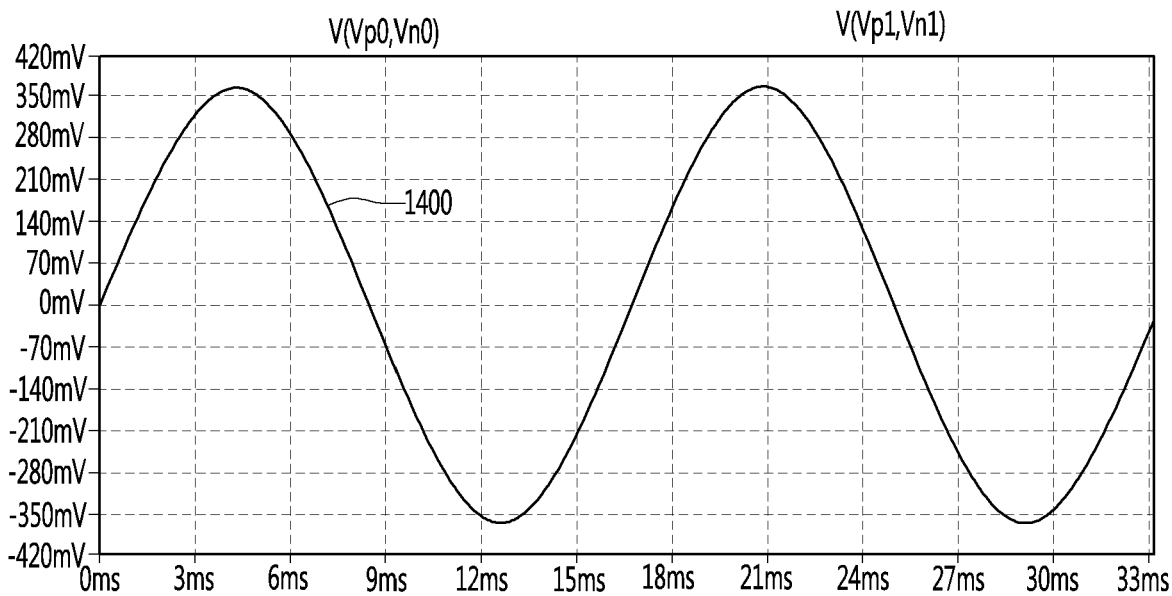
FIG. 14 is a graph illustrating the comparison between outputs of signals observed in Vp–Vn when a 60 Hz reference frequency signal is applied to the conventional magnetic sensor and the magnetic sensor according to an embodiment of the present invention.

FIG. 14 is a graph illustrating the comparison between outputs of signals observed in Vp–Vn when a 60 Hz reference frequency signal is applied to the conventional magnetic sensor and the magnetic sensor according to an embodiment of the present invention.

A reference frequency signal having the frequency of 60 Hz may be an AC current signal having the frequency of 60 Hz.

Referring to FIG. 14, when the reference frequency signal having the frequency of 60 Hz is applied to the conventional magnetic sensor 1310 and the magnetic sensor 1330 according to an embodiment of the present invention, the signals observed in Vp–Vn may have the same waveform 1400 (that is, does not overlap with each other).

In other words, the magnetic sensor 1330 according to an embodiment of the present invention has the same performance when outputting of the reference frequency signal.

Figure 15:
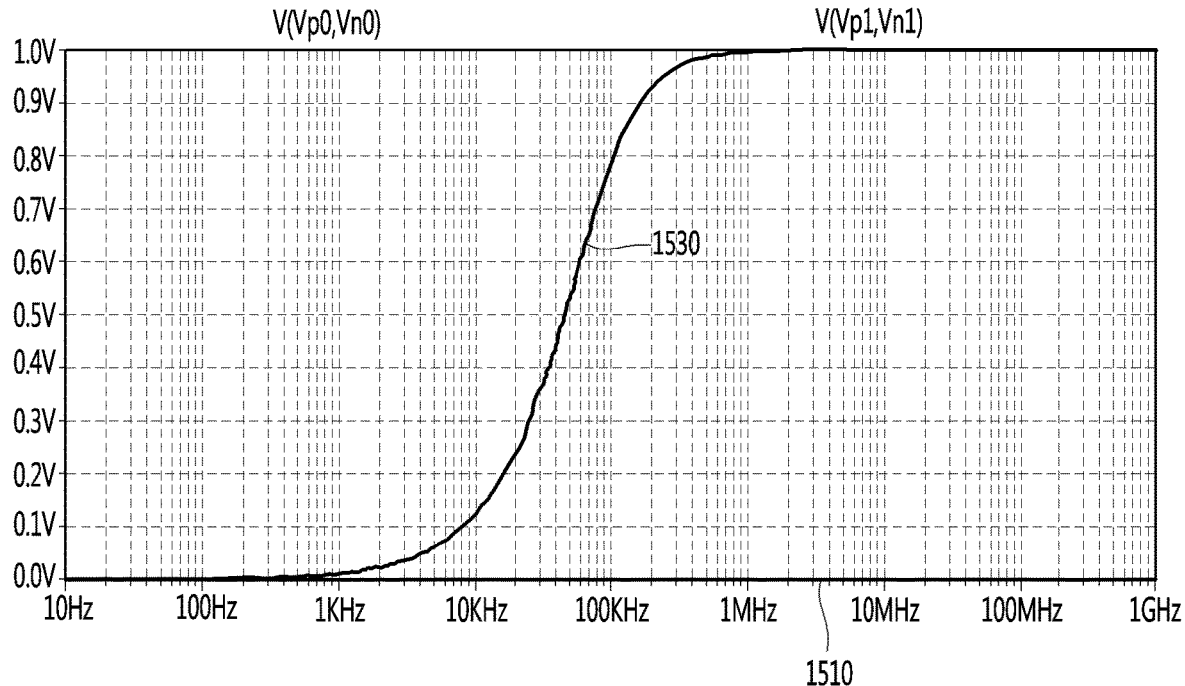
FIG. 15 is a graph the comparison between the outputs of differential signals (Vp−Vn) depending on the frequencies of the high-frequency signal applied to the conventional magnetic sensor and the magnetic sensor according to an embodiment of the present invention.

FIG. 15 is a graph the comparison between the outputs of differential signals (Vp–Vn) depending on the frequencies of the high-frequency signal applied to the conventional magnetic sensor and the magnetic sensor according to an embodiment of the present invention.

FIG. 15 illustrates a first differential output signal 1510 depending on the frequency of the high-frequency signal applied to the terminal 1311 of the conventional magnetic sensor 1310 and a second differential output signal 1530 depending on the frequency of the high-frequency signal applied to a PD input terminal 1331 of the magnetic sensor 1330 according to an embodiment of the present invention.

The high-frequency signal applied to each terminal may be a partial discharge signal.

The second differential output signal 1530 may have a more excellent response characteristic to a high-frequency signal having the frequency of 1 MHz or more when compared with the first differential output signal 1510.

In addition, a cut-off frequency may be adjusted by using intensities of a resistor of the magnetic sensor 1330 and capacitors C1 and C2 additionally mounted in the magnetic sensor 1330. The cut-off frequency may be a frequency of a voltage corresponding to 70% of the maximum output voltage. In FIG. 15, the cut-off frequency may be 1 MHz.

Figure 16A:
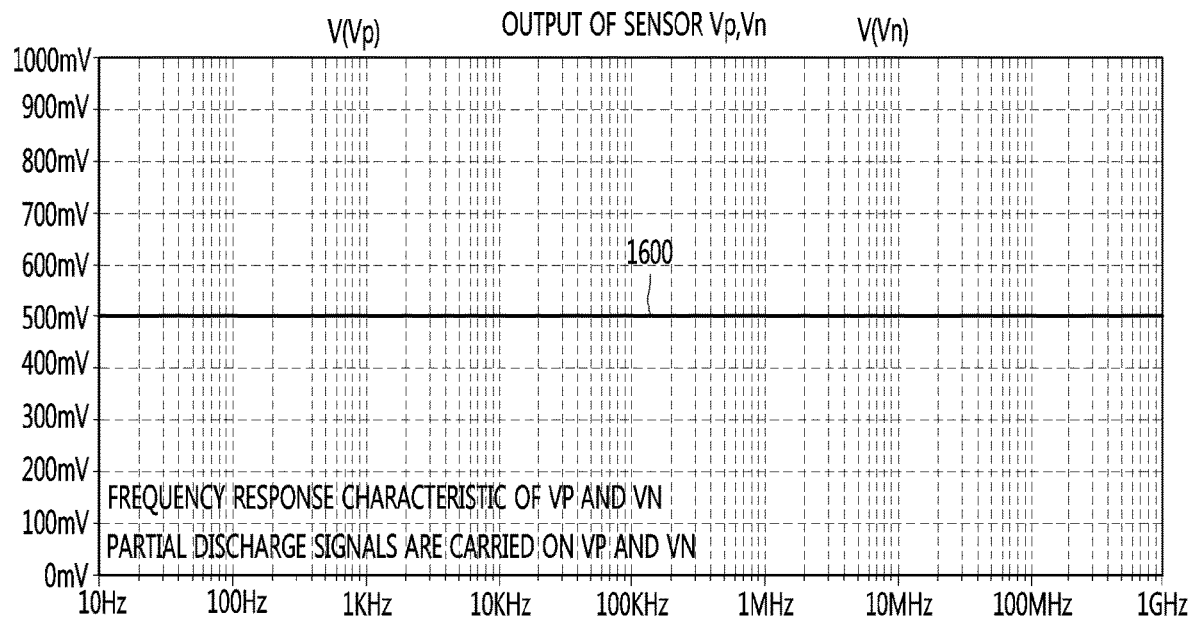
FIGS. 16A and 16B are graphs illustrating output results of a high-frequency partial discharge signal and the Hz reference frequency signal, when the conventional magnetic sensor is used.
Figure 16B:
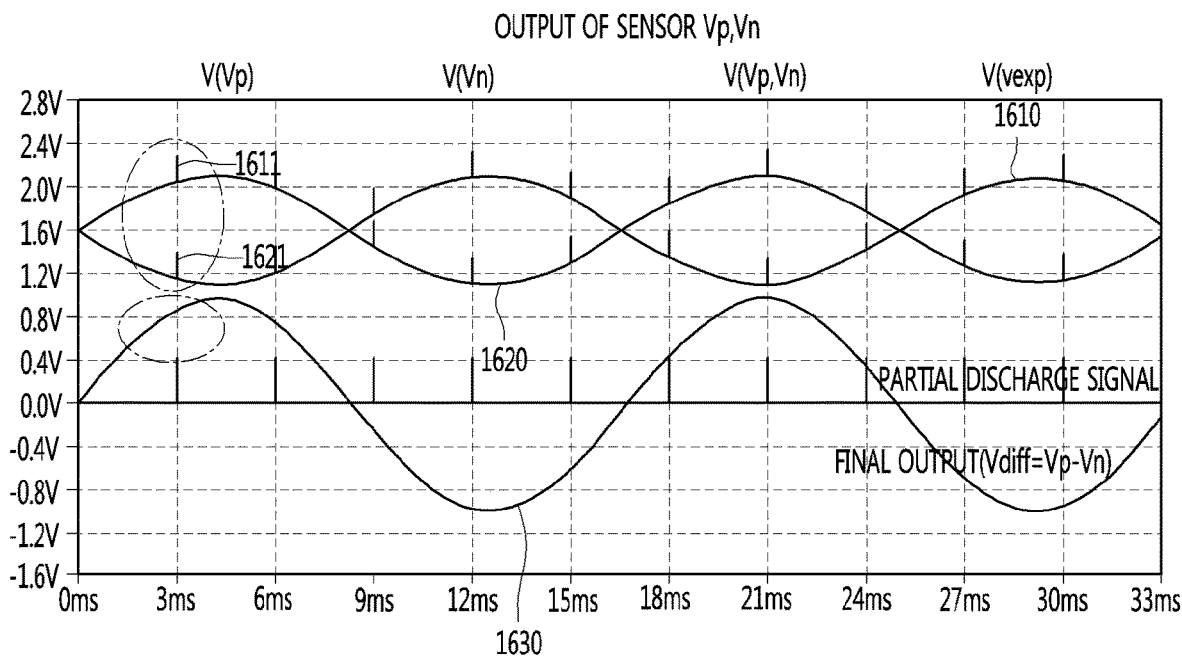

FIGS. 16A and 16B are graphs illustrating output results of a high-frequency partial discharge signal and a reference frequency signal having the frequency of 60 Hz, when a conventional magnetic sensor is used.

FIG. 16A illustrates frequency response characteristic waveforms 1600 output from terminals Vp and Vn of the conventional magnetic sensor 1310. Since the frequency response characteristic waveforms 1600 output from terminals Vp and Vn have the same waveform, the frequency response characteristic waveforms 1600 are not present in overlap with each other.

FIG. 16B illustrates a first waveform 1610, a second waveform 1620, and a third waveform 1630 output from the terminal Vp, the terminal Vn, and the differential terminal of the conventional magnetic sensor 1310.

Referring to FIG. 16B, it may be recognized that a first partial discharge signal 1611 and a second partial discharge signal 1621 are carried in the first waveform 1610 and the second waveform 1620, respectively.

In the third waveform 1630 output from the differential terminal, all components of the high-frequency partial discharge signal are canceled by the differential signal and thus not output.

Figure 17A:
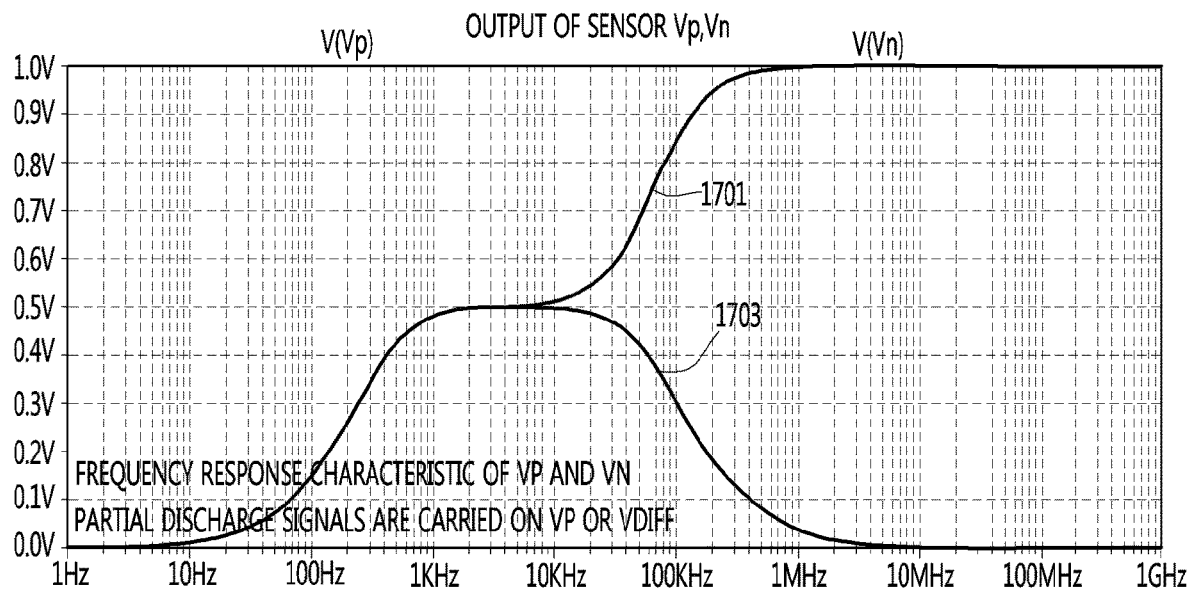
FIGS. 17A and 17B are graphs illustrating output results of the high-frequency partial discharge signal and the 60-Hz reference frequency signal, when a magnetic sensor is used according to an embodiment of the present invention.
Figure 17B:
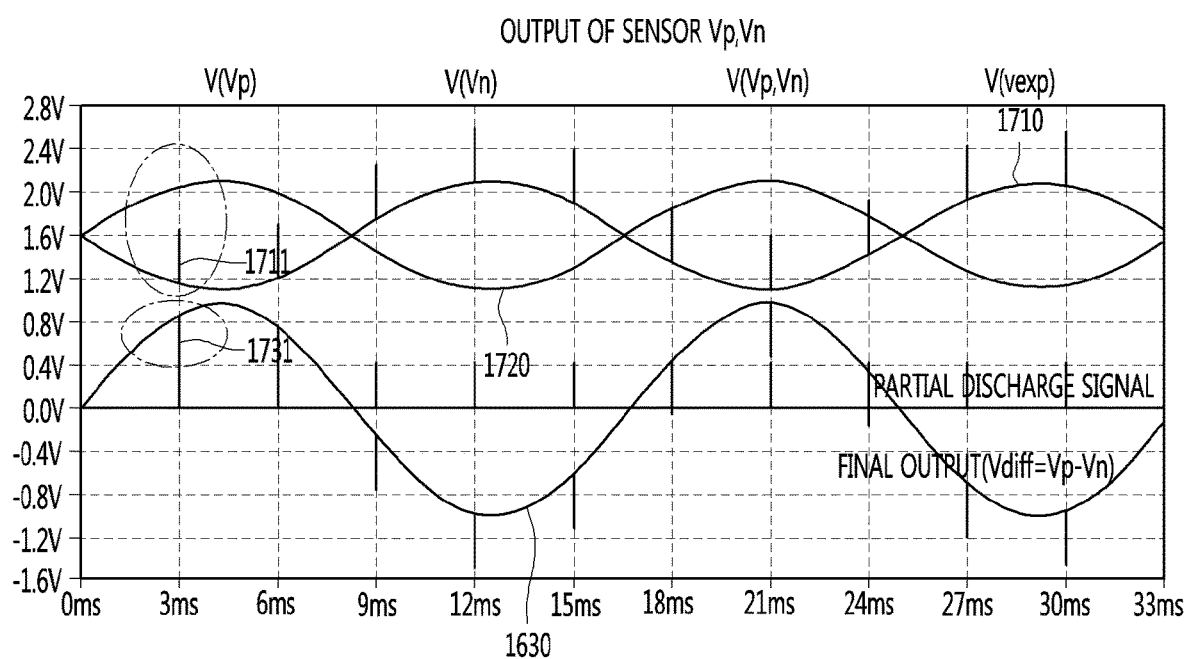

FIGS. 17A and 17B are graphs illustrating output results of a high-frequency partial discharge signal and a reference frequency signal of 60 Hz, when a magnetic sensor is used according to an embodiment of the present invention.

FIG. 17A illustrates a frequency response characteristic waveform 1701 and a frequency response characteristic waveform 1703 output from the terminals Vp and Vn of the magnetic sensor 1330, respectively, according to an embodiment of the present invention.

FIG. 17B illustrates a first waveform 1710, a second waveform 1720, and a third waveform 1730 output from the terminal Vp, the terminal Vn, and the differential terminal of the magnetic sensor 1330 according to an embodiment of the present invention.

It may be recognized that the partial discharge signal is carried only in the second waveform 1720 and not in the first waveform 1710.

It may be recognized that a partial discharge signal 1731 is carried in the third waveform 1730 output from the differential terminal.

In other words, when the magnetic sensor 1330 according to an embodiment of the present invention is used, the high-frequency partial discharge signal may be detected at the differential terminal, which is different from the conventional magnetic sensor 1310.

Figure 18A:
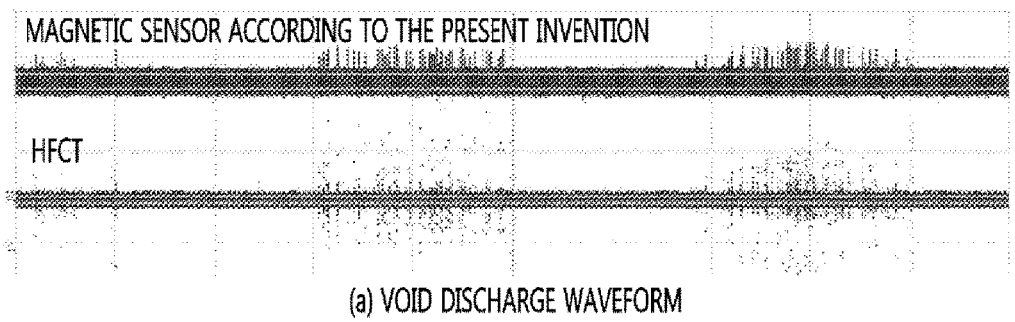
FIG. 18A is a view illustrating the comparison between waveforms acquired by using a high frequency current transformer (HFCT) sensor which is usually applied to a void partial discharge waveform and a magnetic sensor according to an embodiment of the present invention.

FIG. 18A is a view illustrating the comparison between waveforms acquired by using a high frequency current transformer (HFCT) sensor which is usually applied to a void partial discharge waveform and a magnetic sensor according to an embodiment of the present invention.

Referring to FIG. 18A, the partial discharge waveforms obtained by using a void discharge test sample have the same patterns in both cases of using the magnetic sensor according to the present invention and using an HFCT sensor.

Figure 18B:
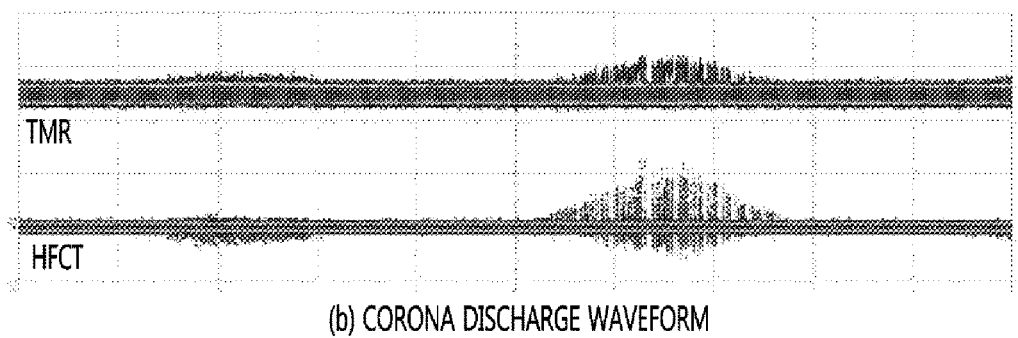
FIG. 18B is a view illustrating the comparison between waveforms acquired by using an HFCT sensor which is usually applied to a corona partial discharge waveform and a magnetic sensor according to an embodiment of the present invention.

FIG. 18B is a view illustrating the comparison between waveforms acquired by using an HFCT sensor which is usually applied to a corona partial discharge waveform and a magnetic sensor according to an embodiment of the present invention.

Referring to FIG. 18B, the partial discharge waveforms acquired by using a corona discharge test sample have the same patterns in both cases of using the magnetic sensor according to the present invention and using the HFCT sensor.

The present invention mentioned in the foregoing description may be implemented using a machine-readable medium having instructions stored thereon for execution by a processor to perform various methods presented herein. Examples of possible machine-readable mediums include HDD (Hard Disk Drive), SSD (Solid State Disk), SDD (Silicon Disk Drive), ROM, RAM, CD-ROM, a magnetic tape, a floppy disk, an optical data storage device, the other types of storage mediums presented herein, and combinations thereof. If desired, the machine-readable medium may be realized in the form of a carrier wave (for example, a transmission over the Internet). The foregoing embodiments are merely exemplary and are not to be considered as limiting the present disclosure. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds, are therefore intended to be embraced by the appended claims.

What is claimed is:

1. A partial discharge detecting system comprising:
a partial discharge detecting device configured to:
generate a reference frequency signal,
detect a partial discharge pulse signal, and
convert the partial discharge pulse signal into a partial discharge digital signal;
a main processor configured to:
synchronize the partial discharge digital signal with the reference frequency signal based on a zero-phase point of the reference frequency signal to generate a synchronized partial discharge digital signal,
extract effective data from the synchronized partial discharge digital signal, and
store the extracted effective data; and
an energy harvesting power supply device configured to supply power to the partial discharge detecting device and the main processor,
wherein the main processor is further configured to:
buffer a unit partial discharge digital signal in a one-cycle unit from the synchronized partial discharge digital signal, wherein the unit partial discharge digital signal includes a plurality of partial discharge points,
extract a partial discharge peak point exceeding a reference voltage from the plurality of partial discharge points, and
store only the extracted partial discharge peak point as the effective data.

2. The partial discharge detecting system of claim 1, wherein the effective data includes cycle information corresponding to the partial discharge peak point, voltage size information corresponding to the partial discharge peak point, and phase information corresponding to the partial discharge peak point.

3. The partial discharge detecting system of claim 2, wherein the main processor is further configured to:
repeatedly extract the effective data for a plurality of cycles of the synchronized partial discharge digital signal,
determine whether a number of the plurality of cycles corresponds to a reference number of times for ensuring an analysis scheme, and
when the number of the plurality of cycles corresponds to the reference number of times, generate one or more effective data packets by combining the effective data for the plurality of cycles.

4. The partial discharge detecting system of claim 3, wherein the one or more effective data packets include an arrangement of the effective data corresponding to a plurality of discharge peak points in the synchronized partial discharge digital signal.

5. The partial discharge detecting system of claim 4, wherein the arrangement of the effective data includes the effective data being compressed into an array.

6. The partial discharge detecting system of claim 4, further comprising:
a wireless communication device configured to transmit the one or more effective data packets to a partial discharge analysis system through a low power wide area network standard.

7. The partial discharge detecting system of claim 4, wherein the wireless communication device is configured to transmit the one or more effective data packets to the partial discharge analysis system, based on a low-power remote network standard.

8. The partial discharge detecting system of claim 1, wherein the partial discharge detecting device includes:
a partial discharge detecting sensor configured to detect the partial discharge pulse signal.

9. The partial discharge detecting system of claim 8, wherein the partial discharge detecting sensor includes a magnetic sensor.

10. The partial discharge detecting system of claim 1, wherein the energy harvesting power supply includes:
a solar cell configured to absorb solar energy; and
a battery configured to store electrical energy converted from the solar energy.

11. A partial discharge detecting device comprising:
a partial discharge detecting sensor configured to detect an analog partial discharge pulse signal; and
a processor configured to:
generate a reference frequency signal,
convert the analog partial discharge pulse signal into a partial discharge digital signal;

synchronize the partial discharge digital signal with the reference frequency signal, extract effective data from the partial discharge digital signal based on synchronization between the partial discharge digital signal and the reference frequency signal, and store the extracted effective data, wherein the processor is further configured to:

buffer a unit partial discharge digital signal in a one-cycle unit from the synchronized partial discharge digital signal, wherein the unit partial discharge digital signal includes a plurality of partial discharge points, extract a partial discharge peak point exceeding a reference voltage from the plurality of partial discharge points, and store only the extracted partial discharge peak point as the effective data.

12. The partial discharge detecting device of claim 11, further comprising:

an energy harvesting power supply device configured to supply power to the partial discharge detecting device and the processor.

13. The partial discharge detecting device of claim 11, wherein the partial discharge digital signal is synchronized with the reference frequency signal based on a zero-phase point of the reference frequency signal.

14. The partial discharge detecting device of claim 11, wherein the processor is further configured to:

generate one or more data packets based on the extracted effective data, and transmit the one or more data packets to an external device or external server.

15. The partial discharge detecting system of claim 11, further comprising:

a wireless communication device, wherein the processor is further configured to:

generate one or more data packets based on the extracted effective data, and transmit, via the wireless communication device, the one or more data packets to an external device or external server through a low power wide area network standard.

* * * * *